(12) United States Patent
Howell et al.

(10) Patent No.: US 6,605,526 B1
(45) Date of Patent: Aug. 12, 2003

(54) WIREBOND PASSIVATION PAD CONNECTION USING HEATED CAPILLARY

(75) Inventors: Wayne John Howell, Williston, VT (US); Ronald Lee Mendelson, Richmond, VT (US); William Thomas Motsiff, Essex Junction, VT (US); Jean-Guy Quintal, Rang Ouest (CA); Sylvain Ouimet, St-Hubert (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/527,141

(22) Filed: Mar. 16, 2000

(51) Int. Cl.[7] .......................................... H01L 21/4763
(52) U.S. Cl. ...................... 438/618; 438/695; 438/734; 252/390
(58) Field of Search ................................. 438/618, 694, 438/695, 696, 734; 252/390

(56) References Cited

U.S. PATENT DOCUMENTS

| | | | |
|---|---|---|---|
| 3,577,631 A | * 5/1971 | Bylander et al. ............. 29/572 |
| 4,097,889 A | 6/1978 | Kern et al. |
| 5,028,489 A | * 7/1991 | Kissel ........................ 428/469 |
| 5,060,050 A | * 10/1991 | Tsuneoka et al. ............. 357/71 |
| 5,336,636 A | * 8/1994 | Burmer ....................... 437/173 |
| 5,420,069 A | * 5/1995 | Joshi et al. .................. 437/187 |
| 5,481,135 A | 1/1996 | Chandra et al. |
| 5,567,981 A | 10/1996 | Bhansali et al. |
| 5,578,530 A | 11/1996 | Muroyama et al. |
| 5,591,494 A | 1/1997 | Sato et al. |
| 5,825,078 A | 10/1998 | Michael |
| 5,861,347 A | * 1/1999 | Maiti et al. .................. 438/787 |
| 5,874,354 A | * 2/1999 | Heitzer et al. .............. 438/612 |
| 6,083,822 A | * 4/2000 | Lee ............................ 438/624 |
| 6,077,733 A | * 6/2000 | Chen et al. .................. 438/182 |
| 6,093,630 A | * 7/2000 | Geffken et al. ............. 438/612 |
| 6,120,705 A | * 9/2000 | Spellane et al. ............. 252/390 |

* cited by examiner

Primary Examiner—Matthew Smith
Assistant Examiner—Renzo N. Rocchegiani
(74) Attorney, Agent, or Firm—McGinn & Gibb, PLLC; Mark F. Chadurjian, Esq.

(57) ABSTRACT

A method for forming a wirebond connection to an integrated circuit structure includes forming an insulative structure overlaying a corrosion susceptible metal wiring within the integrated circuit structure, defining a via through the insulative structure above a portion of the corrosion susceptible metal without exposing the portion of the corrosion susceptible metal, and attaching a wirebond material to the portion of the corrosion susceptible metal. The attaching process includes a preliminary process of exposing the portion of the corrosion susceptible metal. The attaching completely covers the portion of the corrosion susceptible metal.

17 Claims, 3 Drawing Sheets

Figure 9

WIREBOND PASSIVATION PAD CONNECTION USING HEATED CAPILLARY

BACKGROUND OF THE INVENTION

1. Field of the Invention

The present invention generally relates to electrical connections formed on the exterior of semiconductor integrated circuit die structures and more particularly to an improved connection which eliminates the corrosion of exposed copper wiring on the die.

2. Description of the Related Art

Electrical connections are formed along the exterior of an integrated circuit die to permit access to the logic circuitry contained within the die. Wirebonds, typically formed from gold wire, are conventionally used to connect the last layer of metal on the integrated circuit die to the exterior environment. Typically, the last layer of metal within a high performance integrated circuit is copper.

However, copper is not a self-passivating metal and easily corrodes when left exposed. Therefore, it is conventionally necessary to form protective pads or other permanent conductive features over the copper wiring to prevent corrosions of the exposed copper. These pads are typically made of a less corrosion susceptible or self-passivating material such as tungsten, titanium, tantalum, aluminum, etc. The inclusion of protective pads in the structure is undesirable because of the additional materials, processing steps, and manufacturing complexity which potentially decrease die yield.

The invention described below overcomes the problems of conventional structures and processes by employing a structure and process that protects the copper wiring from exposure until just before the wirebond (or other electrical connection) is formed. This eliminates the need for additional structures such as conductive pads, yet still protects the copper from corrosion.

SUMMARY OF THE INVENTION

It is therefore, an object of the present invention to provide a method for forming a wirebond connection to an integrated circuit structure. The method includes forming an insulative, protective structure overlaying a corrosion susceptible metal wiring layer within the integrated circuit structure, defining a via partially through the thickness of the insulative structure above a portion of the corrosion susceptible metal without exposing the portion of the metal, and applying a conductive material to the portion of the corrosion susceptible metal. The attaching process included a preliminary process of at least partially exposing the portion of the corrosion susceptible metal. The conductive material completely covers the portion of the corrosion susceptible metal.

The invention removes a remaining portion of the insulative structure to expose the portion of the corrosion susceptible metal. This is performed through etching, laser ablation, or physically contacting the wirebond material against a remaining portion of the insulative material to expose the portion of the corrosion susceptible metal where the conductive material is applied to the corrosion susceptible metal using a heated capillary. In a preferred embodiment the conductive connection is a gold wirebond, and the corrosion susceptible metal wiring is copper. This process prevents the corrosion susceptible metal wiring from being exposed.

In another embodiment, the method includes forming an insulative structure overlaying a corrosion susceptible metal wiring within the integrated circuit structure, defining a via through the insulative structure above a portion of the corrosion susceptible metal, forming a protective barrier in the via, and applying a conductive material to the portion of the corrosion susceptible metal. The applying process includes a preliminary process of at least partially exposing the portion of the corrosion susceptible metal and completely covering the portion of the corrosion susceptible metal.

In another embodiment the invention includes defining a via through an exterior of the integrated circuit structure above a portion of the conductor, without exposing the portion of the conductor and applying a conductive material to the portion of the conductor. Once again, the attaching process includes a preliminary process of exposing at least part of the portion of the conductor.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
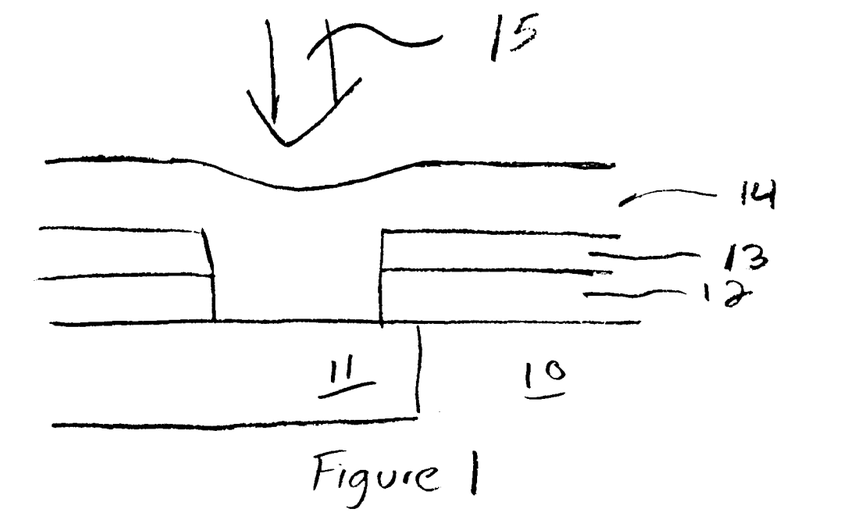
FIGS. 1–3 are schematic diagrams of sequential cross-sectional views of the first embodiment of the invention.
Figure 2:
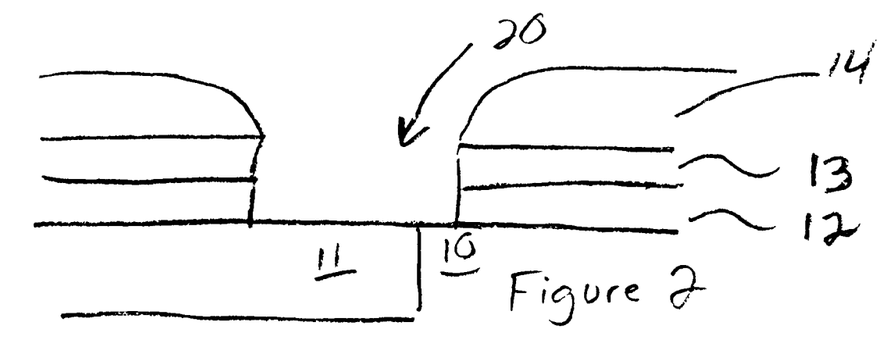
Figure 3:
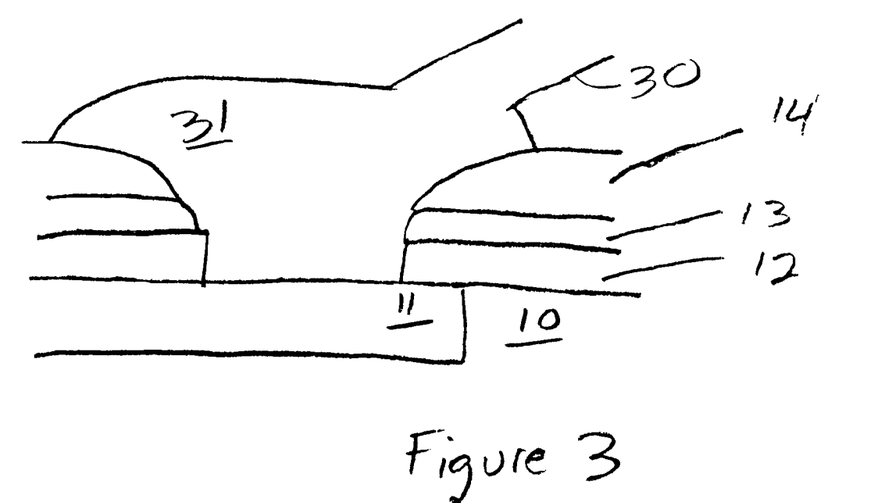

As discussed above, the invention prevents exposed copper from corroding by keeping the copper covered until just before the wirebond is formed. A first embodiment of the invention is illustrated in FIGS. 1–3. More specifically, FIG. 1 illustrates an exterior portion of an integrated circuit which includes an insulating/passivating structure 10. A portion of a conductive wire 11 (which in this preferred embodiment is copper but could be another non-self passivating metal such as silver) is positioned within the insulating structure 10.

Hard insulators 12, 13 are formed over the structure. The hard insulators can be, for example silicon dioxide, silicon nitride, silicon oxide-nitride combinations, etc. The hard insulators 12, 13 serve to protect and isolate the underlying wiring and insulation 10, 11. An opening is formed in the hard insulators 12, 13 using, for example, conventional lithographic masking and etching techniques. The structure is then immediately covered with a suitable polyamide 14 or other suitable protective barrier such as phenolic varnish, epoxy resin, etc. If polyamide is chosen as the barrier, pre-imidized or polyamic ester material are preferred. This process prevents the wiring 11 from being exposed and prevents corrosion of the wiring 11.

The polymide 14 remains on the structure until just before a wirebond connection is formed. When the integrated circuit is ready for the wirebond to be formed, the wirebonding process begins with the application of a laser or other energy source 15 (such as an eximer laser) to ablate or etch the region of the polymide 14 over the wiring 11. This produces an opening 20, as shown in FIG. 2. Immediately thereafter, a heat capillary 30 is used to press and rub (e.g., physically contact) the heated wire bond material 31 against the wiring 11. A spark can be also used with the physical contact of the wire bond material 31 and the wiring 11 to create intermetal connections between the wiring 11 and the wire bond material. In a preferred embodiment the wire bond material 31 comprises gold. The wirebonding process completely covers the wiring 11. In addition to a wirebond per se, any other conductor and application process could be used in this embodiment (as well as other embodiments) of the invention so long as such conductor and application process results in connecting to and passivating the conductor 1.

This process prevents the wiring 11 from being exposed, which prevents any corrosion and insurers a good connection between the wirebond 31 and the wiring 11. The capillary 30 which delivers the wire bond material 31 is heated using a current conductive wire or a heat element.

Figure 4:
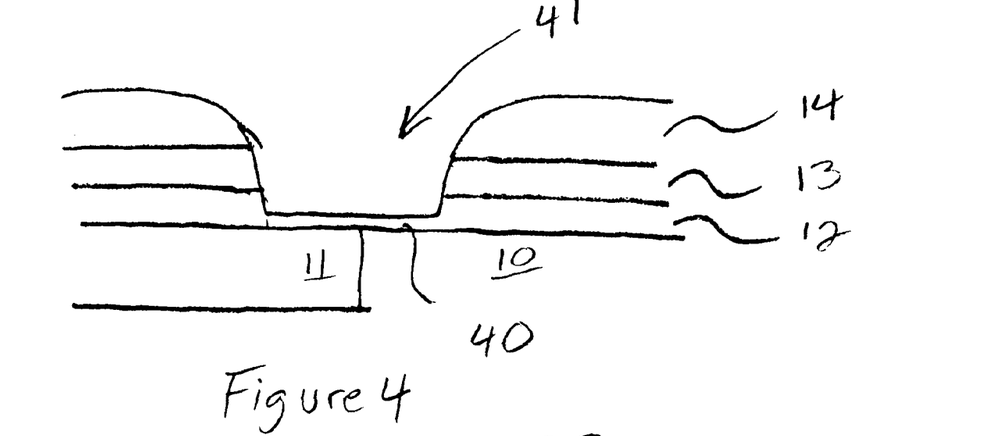
FIGS. 4–6 are schematic diagrams of sequential cross-sectional views of a second embodiment of the invention.
Figure 5:
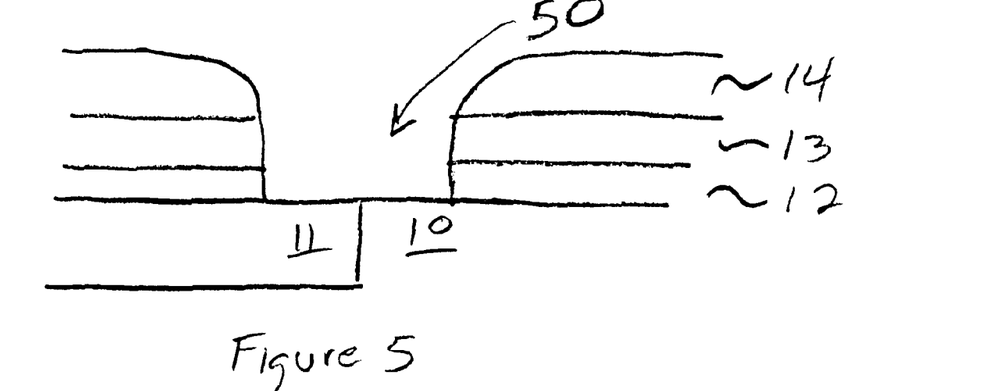
Figure 6:
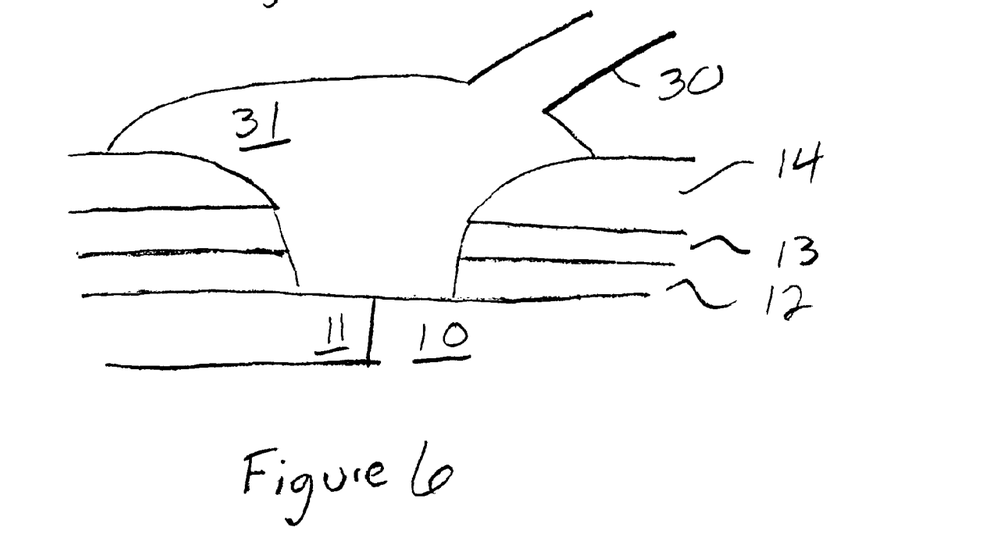

A second embodiment of the invention is shown in FIGS. 4–6. More specifically, FIG. 4 illustrates a structure which is similar to that shown in FIG. 1. However, in the embodiment shown in FIG. 4, the lower hard insulator layer 12 is not completely etched when forming the opening 41. In this example, the hard insulator 12 comprises silicon nitride, having a thinned portion 40 at a thickness of approximately 0.01 to 1 um.

The remaining thin portion of the hard insulator 40 can be removed using a laser, as discussed with the previous embodiment, to form the opening 50 shown in FIG. 5. Alternatively, the wire bond 31 can be applied directly to the opening 41 and, given sufficient thinness of region 40, the wire bond 31 will break through and penetrate the underlying hard insulator 40 during the physical pressing of the wire bond material discussed above. As shown in FIG. 6, this embodiment also results in the formation of the wirebond 31 electrically connected to the wiring 11 without any exposure or corrosion of the wiring 11.

Figure 7:
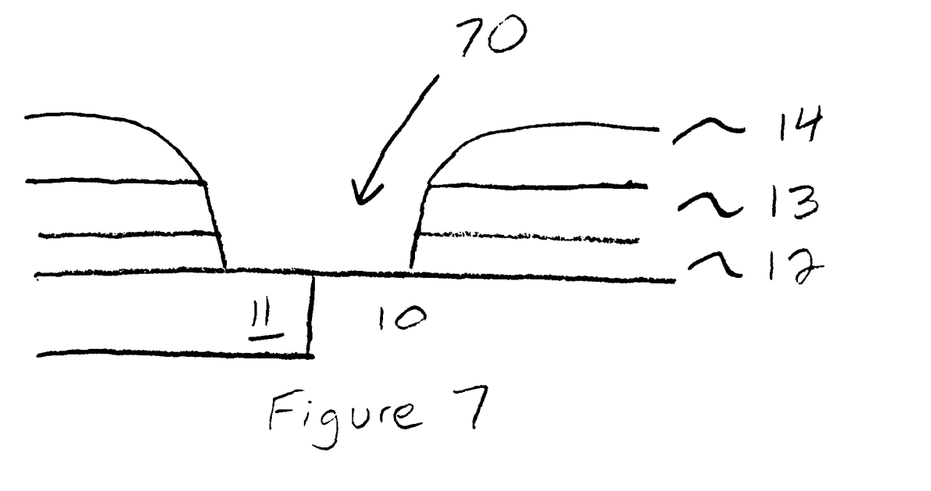
FIGS. 7–9 are schematic diagrams of sequential cross-sectional views of a third embodiment of the invention.
Figure 8:
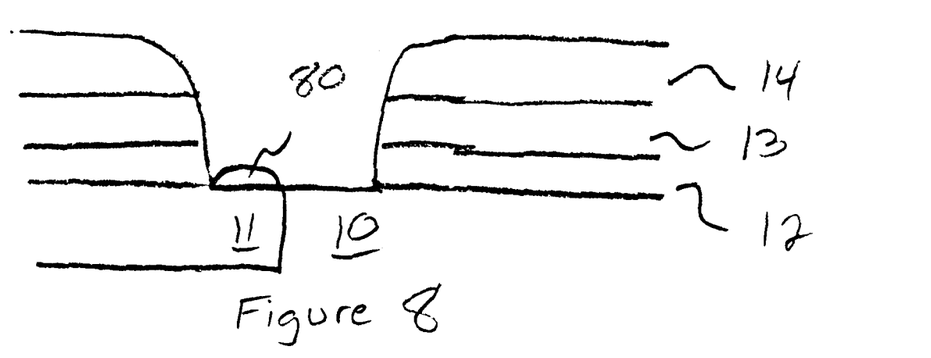

FIGS. 7–9 illustrates a third embodiment of the invention. In this embodiment an opening 70 is formed, as discussed above, through the polymide 14 and the hard insulators 12, 13, exposing a portion of the wiring 11. As shown in FIG. 8, a thin layer of a sacrificial material 80 such as Entek (available from enthone-omi in New Haven, Conn., USA) is deposited only over the wiring 11. Entek is a preferred protective barrier because it only adheres to the wiring 11 and does not require patterning.

Figure 9:
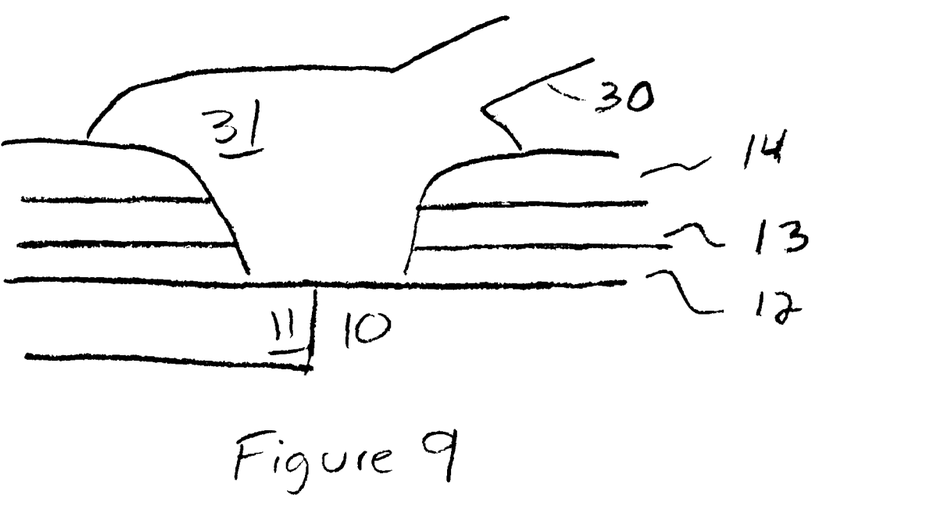

As discussed with the previous embodiments, heat, pressure, and spark are exerted upon the sacrificial material 80 during the formation of the wire bond 31 through the capillary 30. As shown in FIG. 9, this heat and pressure break through the sacrificial material 80 to allow a high-quality connection between the uncorroded wiring 11 and the wirebond 31.

While the invention has been described in terms of preferred embodiments, those skilled in the art will recognize that the invention can be practiced with modification within the spirit and scope of the appended claims.

What is claimed is:

1. A method of forming a wirebond connection to a corrosion susceptible metal wiring, said method comprising:
    forming an insulative structure overlaying said corrosion susceptible metal wiring;
    defining a via through said insulative structure above a portion of said corrosion susceptible metal leaving a protective barrier on said portion of said corrosion susceptible metal; and
    attaching a wirebond material to said portion of said corrosion susceptible metal with a heated capillary, said attaching including a preliminary process of exposing said portion of said corrosion susceptible metal, said attaching completely covering said portion of said corrosion susceptible metal, wherein said preliminary process of at least partially exposing comprises physically contacting said conductive material against a remaining portion of said insulative material to expose said portion of said corrosion susceptible metal by breaking through said protective barrier without a separate etch step.

2. The method in claim 1, wherein said heated capillary is heated using one of a current conductive wire and a heat element.

3. The method in claim 2, wherein said wirebond material comprises gold and said corrosion susceptible metal wiring comprises copper.

4. The method in claim 1, wherein said applying process prevents said corrosion susceptible metal wiring from being exposed.

5. A method of forming a wirebond connection to an integrated circuit structure, said method comprising:
    forming an insulative structure overlaying a corrosion susceptible metal wiring within said integrated circuit structure;
    defining a via through said insulative structure above a portion of said corrosion susceptible metal;
    forming a protective barrier in said via; and
    attaching a wirebond material to said portion of said corrosion susceptible-metal with a heated capillary so as to expose said portion of said corrosion susceptible metal by breaking through said protective barrier without a separate etch step, said attaching completely covering said portion of said corrosion susceptible metal.

6. The method in claim 5, wherein said protective barrier comprises Entek and said exposing comprises physically contacting said wirebond material against a portion of said insulative material to expose said portion of said corrosion susceptible metal.

7. The method in claim 5, wherein said heated capillary is heated using one of a current conductive wire and a heat element.

8. The method in claim 5, wherein said wirebond material comprises gold and said corrosion susceptible metal wiring comprises copper.

9. The method in claim 5, wherein said attaching process prevents said corrosion susceptible metal wiring from being exposed.

10. A method of forming a connection to a conductor within an integrated circuit structure, said method comprising:
    defining a via through an exterior of said integrated circuit structure above a portion of said conductor while retaining a thin insulator on said portion of said conductor; and
    attaching a wirebond material to said portion of said conductor with a heated capillary, by breaking through said thin insulator disposed on said portion of said conductor without a separate etch step.

11. The method in claim 10, wherein said attaching completely covers said portion of said conductor.

12. The method in claim 10, wherein said conductor comprises a metal that corrodes when exposed.

13. The method in claim 10 wherein said attaching step comprises physically contacting said wirebond material against said thin insulator to expose said portion of said corrosion susceptible metal.

14. The method in claim 13, wherein said attaching step comprises applying one of heat, pressure, and spark to said thin insulator.

15. The method in claim 10, said heated capillary is heated using one of a current conductive wire and a heat element.

16. The method in claim 10, wherein said wirebond material comprises gold and said conductor comprises copper.

17. The method in claim 10, wherein said attaching process prevents said corrosion susceptible metal wiring from being exposed.

* * * * *

UNITED STATES PATENT AND TRADEMARK OFFICE
CERTIFICATE OF CORRECTION

PATENT NO. : 6,605,526 B1
DATED : August 12, 2003
INVENTOR(S) : Howell et al.

It is certified that error appears in the above-identified patent and that said Letters Patent is hereby corrected as shown below:

Please substitute Figs. 1-9 with the attached formal drawings of Figs. 1-9.

Signed and Sealed this

Sixth Day of January, 2004

JAMES E. ROGAN
*Director of the United States Patent and Trademark Office*